United States Patent
Bell et al.

(10) Patent No.: US 7,307,481 B1
(45) Date of Patent: Dec. 11, 2007

(54) MINIMUM SYNCHRONIZATION FREQUENCY DISCRIMINATOR

(75) Inventors: Robert Bell, Chandler, AZ (US); Robert Oppen, Chandler, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 96 days.

(21) Appl. No.: 11/242,238

(22) Filed: Oct. 3, 2005

(51) Int. Cl.
*H03B 28/00* (2006.01)
*H03K 3/02* (2006.01)

(52) U.S. Cl. .......................... 331/49; 331/55; 331/111; 331/145; 331/172; 323/282

(58) Field of Classification Search ................ 331/46, 331/49, 55, 111, 143, 145, 153, 172, 175; 327/39, 41, 43, 49; 323/282
See application file for complete search history.

(56) References Cited

U.S. PATENT DOCUMENTS

| | | | | |
|---|---|---|---|---|
| 4,816,776 A | * | 3/1989 | Kessler | .......................... 331/49 |
| 5,101,127 A | * | 3/1992 | Simpson | ....................... 327/42 |
| 6,850,101 B1 | * | 2/2005 | De Stasi | ...................... 327/141 |
| 6,970,045 B1 | * | 11/2005 | Lichter et al. | .................. 331/2 |
| 2004/0190331 A1 | * | 9/2004 | Ross et al. | ................... 365/154 |

* cited by examiner

*Primary Examiner*—Benny Lee
*Assistant Examiner*—Ryan J Johnson
(74) *Attorney, Agent, or Firm*—Brett A. Hertzberg; Merchant & Gould PC

(57) ABSTRACT

A minimum frequency synchronization discriminator for use in providing a clock signal for a switch mode power supply automatically detects when the frequency of a sync signal is above a minimum frequency and causes the sync signal to serve as the clock signal for the controller. If the frequency of the sync signal is below the minimum frequency, the minimum synchronization frequency discriminator causes the output signal of the internal oscillator to serve as the clock signal.

18 Claims, 3 Drawing Sheets

MINIMUM SYNCHRONIZATION FREQUENCY DISCRIMINATOR

BACKGROUND

Switch mode power supplies (SMPSs) are used in many electrical devices to receive electrical energy with one set of parameters (e.g., from a power source) and transform and regulate the received electrical energy to another set of parameters, typically for use by other components of the electrical devices. For example, SMPSs can be used to perform DC-to-DC power conversion in both stepping up and stepping-down an input voltage.

Some SMPS implementations use a controller circuit to control the activation of the switch used to regulate the output voltage of the SMPS. Typical controller implementations include an oscillator frequency for timing and control functions of the SMPS. In some implementations, the oscillator is user-programmable by providing a mechanism for the user to connect circuitry (e.g., a resistor) to the control circuitry of the oscillator. Further, in some applications, it is desirable to synchronize the oscillator output signal(s) with a system or master clock signal of the SMPS.

SUMMARY

This summary is provided to introduce a selection of concepts in a simplified form that are further described below in the Detail Description Section. This summary is not intended to identify key features or essential features of the claimed subject matter, nor is it intended to be used as an aid in determining the scope of the claimed subject matter.

According to aspects of various described embodiments, a minimum synchronization frequency discriminator (e.g., for use in a SMPS controller) is provided. In one aspect, the minimum synchronization frequency discriminator includes a "replica" circuit, a comparator, a sample circuit, and a multiplexer. The input signals of the multiplexer are an external synchronization (sync) signal (e.g., the master or system clock signal) and the output signal of the controller oscillator (also referred to herein as the internal oscillator). The replica circuit is designed to replicate or match components of the internal oscillator of the SMPS controller. Because they are matched, the internal oscillator and the replica circuit can each generate an oscillating voltage signal (e.g., a saw tooth signal) having rising and falling edges with matching slopes. However, in this aspect, transitions between edges of the oscillating signal of the replica circuit are triggered by edges of the external sync signal. The comparator compares the voltage of this oscillating signal to a reference voltage. The sample circuit samples the comparator's output signal, triggered by the external sync signal. The logic level of the sampled signal is used as the control signal for the multiplexer.

When the external sync signal has a frequency that is faster than that of the internal oscillator, the sample circuit will output a signal of a particular constant logic level to the control node of the multiplexer because the sync signal causes an edge transition of the oscillating signal of the replica circuit before it would occur in the internal oscillator. The multiplexer is configured so that this particular logic level causes the multiplexer to select the external sync signal as the clock signal used by the controller. The clock signal also triggers transitions between edges of the oscillating signal generated by the internal oscillator.

In contrast, when the external sync signal has a frequency that is slower than that of the internal oscillator, the oscillating signal of the replica circuit will not transition before it is sampled, thereby allowing this oscillating signal to ramp to the opposite logic level when it is sampled. Thus, the sample circuit will output a signal of the opposite logic level (compared to when the external sync signal's frequency is faster than that of the internal oscillator). This opposite logic level causes the multiplexer to select the output signal of the internal oscillator as the clock signal.

In this way, the minimum synchronization frequency discriminator automatically discriminates when the frequency of the external sync signal is above a minimum frequency and causes the external sync signal to serve as the clock signal for the controller. If the frequency of the sync signal is below the minimum frequency, the minimum synchronization frequency discriminator causes the output signal of the internal oscillator to serve as the clock signal.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Various embodiments are described more fully below with reference to the accompanying drawings, which form a part hereof, and which show specific exemplary embodiments for practicing various embodiments. However, other embodiments may be implemented in many different forms and should not be construed as limited to the embodiments set forth herein; rather, these embodiments are provided so that this disclosure will be thorough and complete. Embodiments may be practiced as methods, systems or devices. The following detailed description is, therefore, not to be taken in a limiting sense.

A problem with synchronizing the aforementioned SMPS controllers to a master clock signal is that in some implementations if the master clock signal has a lower frequency than the oscillator, circuitry used to detect the sync signal may not detect some of the clock signal pulses, which can result in losing synchronization and/or damaging the SMPS.

Figure 1:
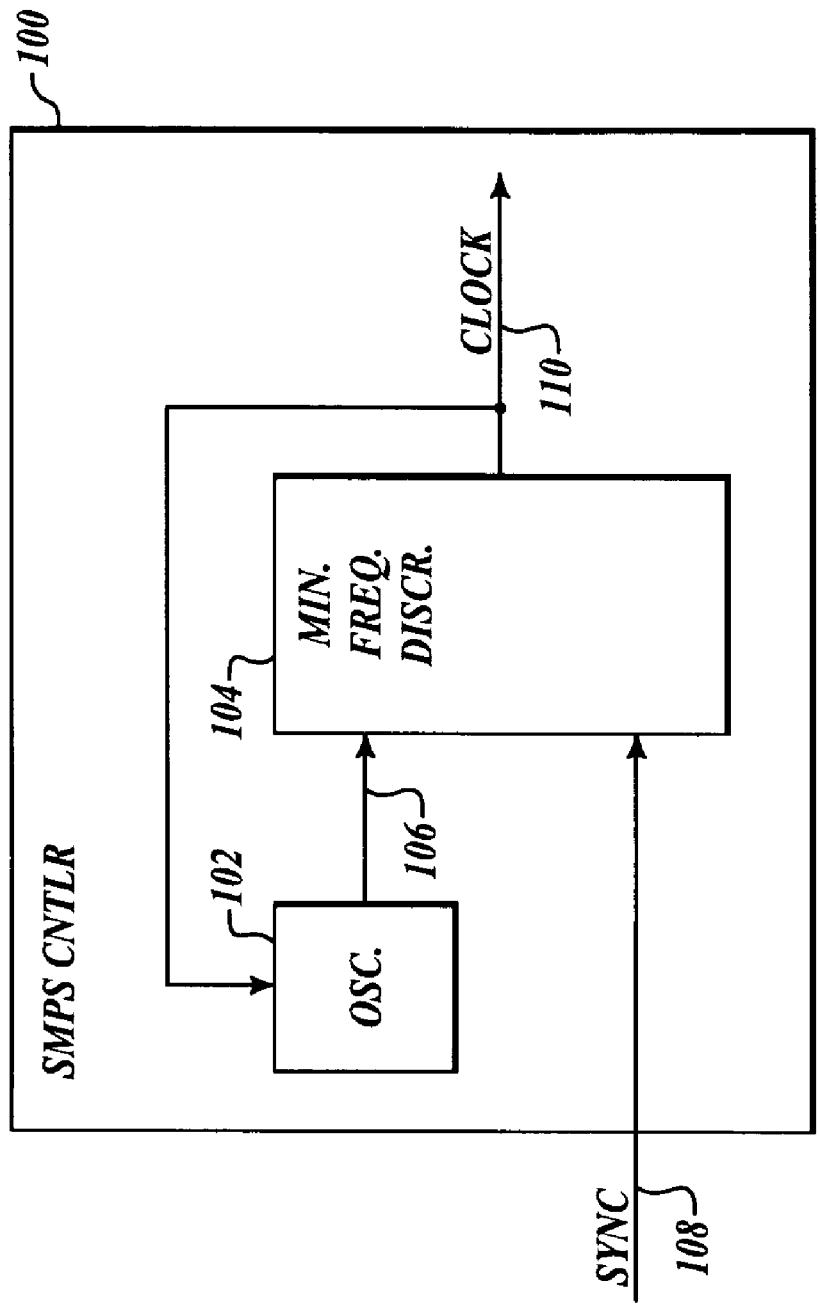
FIG. 1 is a block diagram representing an exemplary switch mode power supply (SMPS) controller with a minimum synchronization frequency discriminator, according to an embodiment.

FIG. 1 is a block diagram representing an exemplary switch mode power supply (SMPS) controller 100, according to an embodiment. In this embodiment, controller 100 includes an internal oscillator 102, and a minimum synchronization frequency discriminator 104. In this exemplary embodiment, minimum synchronization frequency discriminator 104 facilitates oscillator 102 in outputting a clock signal that is used for timing and control of the SMPS. However, in other alternative embodiments, minimum synchronization frequency discriminator 104 (or a portion of minimum synchronization frequency discriminator 104) may be incorporated into or combined with internal oscillator 102.

In this embodiment, minimum synchronization frequency discriminator 104 generates an output signal that is received by internal oscillator 102 via a line 106. Internal oscillator 102 and minimum synchronization frequency discriminator 104 also receive a sync signal (which in some applications is a master or system clock to which controller 100 is to be synchronized with) via a line 108. In this embodiment, internal oscillator 102 outputs the clock signal via a clock output line 110.

In some embodiments, a user can configure or program oscillator 102 to have a fixed frequency. For example, the user may connect a resistor (not shown) to oscillator 102 to program the fixed frequency as in some commercially available SMPS controllers.

In operation, minimum synchronization frequency discriminator 104 receives the external sync signal via line 108 and determines whether the frequency of the external sync signal is greater than that of the output signal of oscillator 102. In some embodiments, minimum synchronization frequency discriminator 104 includes replicas of some of the components of oscillator 102 to derive the frequency of oscillator 102. Two such embodiments are described further below in conjunction with FIGS. 2 and 3.

When the frequency of the external sync signal is greater than that of internal oscillator 102, minimum synchronization frequency discriminator 104 will output a signal, via line 106, with a particular constant logic level (e.g., a logic low) to oscillator 102. Oscillator 102 is configured so that this particular logic level causes oscillator 102 to propagate the external sync signal (received via line 108) to clock output line 110 to serve as the clock signal. In some embodiments, the external sync signal may be propagated to clock output line 110 via one or more logic gates.

In contrast, when the external sync signal has a frequency that is slower than that of internal oscillator 102, minimum synchronization frequency discriminator 104 is configured to output the signal (via line 106) to oscillator 102 with the opposite logic level (compared to when the external sync signal's frequency is faster than that of the internal oscillator). This opposite logic level causes oscillator 102 to propagate its fixed frequency output signal to clock output line 110 to serve as the clock signal.

Thus, minimum synchronization frequency discriminator 104 automatically detects if the frequency of external sync signal is above a minimum frequency (e.g., the fixed frequency output signal of oscillator 102) and propagates the external sync signal to serve as the clock signal for controller 100. Otherwise, minimum synchronization frequency discriminator 104 propagates the fixed frequency output signal of internal oscillator 102 to serve as the clock signal.

Figure 2:
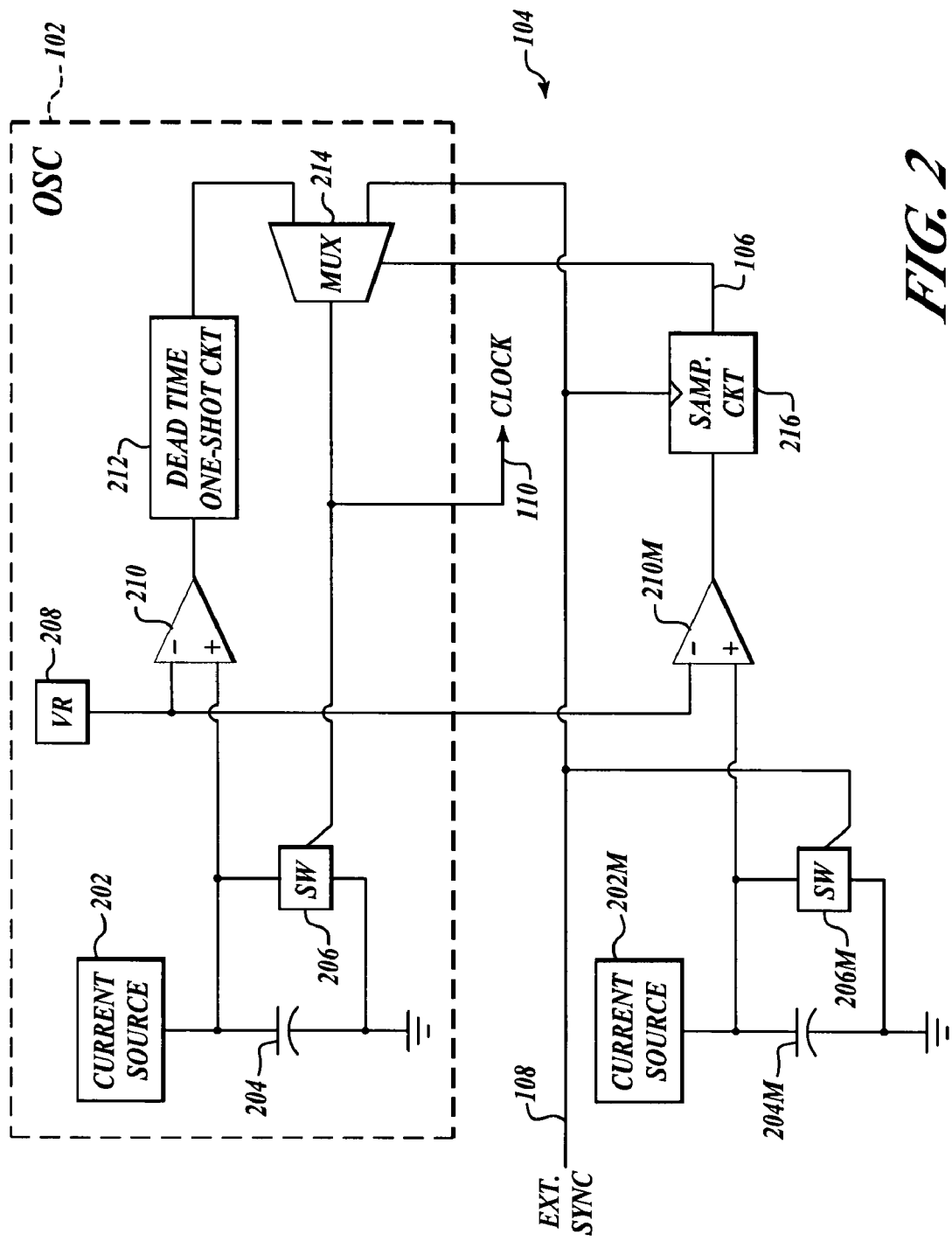
FIG. 2 is a diagram representing exemplary components of the minimum synchronization frequency discriminator of FIG. 1, according to an embodiment.

FIG. 2 is a diagram representing exemplary components of minimum synchronization frequency discriminator 104 (FIG. 1), according to an embodiment. In this example embodiment, oscillator 102 includes a current source 202, a capacitor 204, a switch 206, a voltage regulator 208, a comparator 210, a dead-time one-shot circuit 212, and a multiplexer 214. In this embodiment, minimum synchronization frequency discriminator 104 includes a current source 202M, a capacitor 204M, a switch 206M, and a comparator 210M that, ideally, exactly match current source 202, capacitor 204, switch 206, and comparator 210 of oscillator 102. When fabricated on the same integrated circuit, close matching between such components can be achieved. In this embodiment, minimum synchronization frequency discriminator 104 also includes a sampling circuit 216.

Operation: Sync Signal Frequency Less Than Internal Oscillator Frequency

Current source 202 provides a substantially constant current, which is used to charge capacitor 204 when switch 206 is opened. In some embodiments, current source 202 is programmed using an external programming resistor (not shown), where the magnitude of the current provided by current source 202 is proportional to the resistance of the programming resistor. Closing switch 206 short-circuits the electrodes of capacitor 204 to ground, thereby discharging capacitor 204.

Comparator 210 compares the capacitor voltage to the reference voltage provided by voltage regulator 208. In some embodiments, the reference voltage is slightly less than half of the supply voltage for the controller circuitry. The reference voltage of voltage regulator 208, the capacitance of capacitor 204 and the current provided by current source 202 are selected to achieve the desired frequency of oscillator 102. In some embodiments, the reference voltage of voltage regulator 208 and the capacitance of capacitor 204 are fixed, with the magnitude of the current from current source 202 being user programmable (as previously mentioned).

when the voltage across capacitor 204 reaches the reference voltage, comparator 210 detects this event and triggers dead-time one-shot circuit 212 to generate a pulse with a specified pulse width, which is propagated to the control node of switch 206 (via multiplexer 214 as will be described below). The pulse causes switch 206 to close for the duration of the pulse, thereby discharging capacitor 204. The output signal of multiplexer 214 is also propagated to clock output line 110. Consequently, in this scenario, the duty cycle of the clock signal depends on the rate at which capacitor 204 is charged and the pulse width of the pulse generated by dead-time one-shot circuit 212.

Turning now to the operation of minimum synchronization frequency discriminator 104, current source 202M, capacitor 204M and comparator 210M form a "replica" oscillator that operates as described above for the corresponding components of oscillator 102. Because they are "matched", internal oscillator 102 and the replica circuit each generate an oscillating voltage signal (i.e., a saw tooth signal in this example embodiment) having rising and falling edges with matching slopes.

In this embodiment, switch 206M is controlled by the external sync signal rather than the clock signal as is the case with switch 206 of oscillator 102. Thus, transitions between edges of the saw tooth signal of the replica circuit (caused by charging and discharging capacitor 204M) are triggered by edges of the external sync signal rather than the capacitor voltage reaching the threshold voltage of voltage regulator 208. However, comparator 210M still compares the voltage across capacitor 204M to the reference voltage of voltage regulator 208 and provides its comparator output signal (i.e., a digital signal) as the input signal to sample circuit 216.

The external sync signal also causes sample circuit 216 to sample the logic level of the comparator output signal at the external sync signal's frequency. The logic level of the sampled signal is propagated to multiplexer 214 via line 106 to serve as the multiplexer control signal.

In this scenario, the magnitude of the capacitor voltage will exceed the threshold voltage (i.e., because the lower frequency external sync signal causes switch 206M to discharge capacitor 204M after its voltage level has reached reference voltage level). Thus, as long as the external sync signal has a frequency less than that of oscillator 102, comparator 210M will output a logic high output signal to sampling circuit 216. Consequently, sampling circuit 216 will maintain the logic level of the control signal it provides to multiplexer 214 (which in this scenario causes multiplexer 214 to propagate the one shot output signal to switch 206 and clock output line 110 as described above).

Operation: Sync Signal Frequency Higher Than Internal Oscillator Frequency

In contrast, when the external sync signal has a frequency greater than that of oscillator 102, the magnitude of the capacitor voltage will not reach the threshold voltage (i.e., because the higher frequency external sync signal causes switch 206M to discharge capacitor 204M before its voltage level has reached reference voltage level). Thus, as long as the external sync signal has a frequency greater than that of oscillator 102, comparator 210M will output a logic low output signal to sampling circuit 216. Consequently, sampling circuit 216 will cause the logic level of the control signal it provides to multiplexer 214 to complement, thereby causing multiplexer 214 to propagate the external sync signal to the control terminal of switch 206 and to output clock line 110. Because the external sync signal controls switch 206 (i.e., the timing of the discharge of capacitor 204), oscillator 102 becomes synchronized with the external sync signal. This feature can be advantageous in some scenarios. For example; if the frequency of the external sync signal were to suddenly become less than that of oscillator 102, minimum synchronization frequency discriminator 104 would then cause multiplexer 214 to select the output signal generated by dead-time one-shot circuit 212. Because oscillator 102 has been synchronized with the external sync signal, the transition can be performed smoothly.

Figure 3:
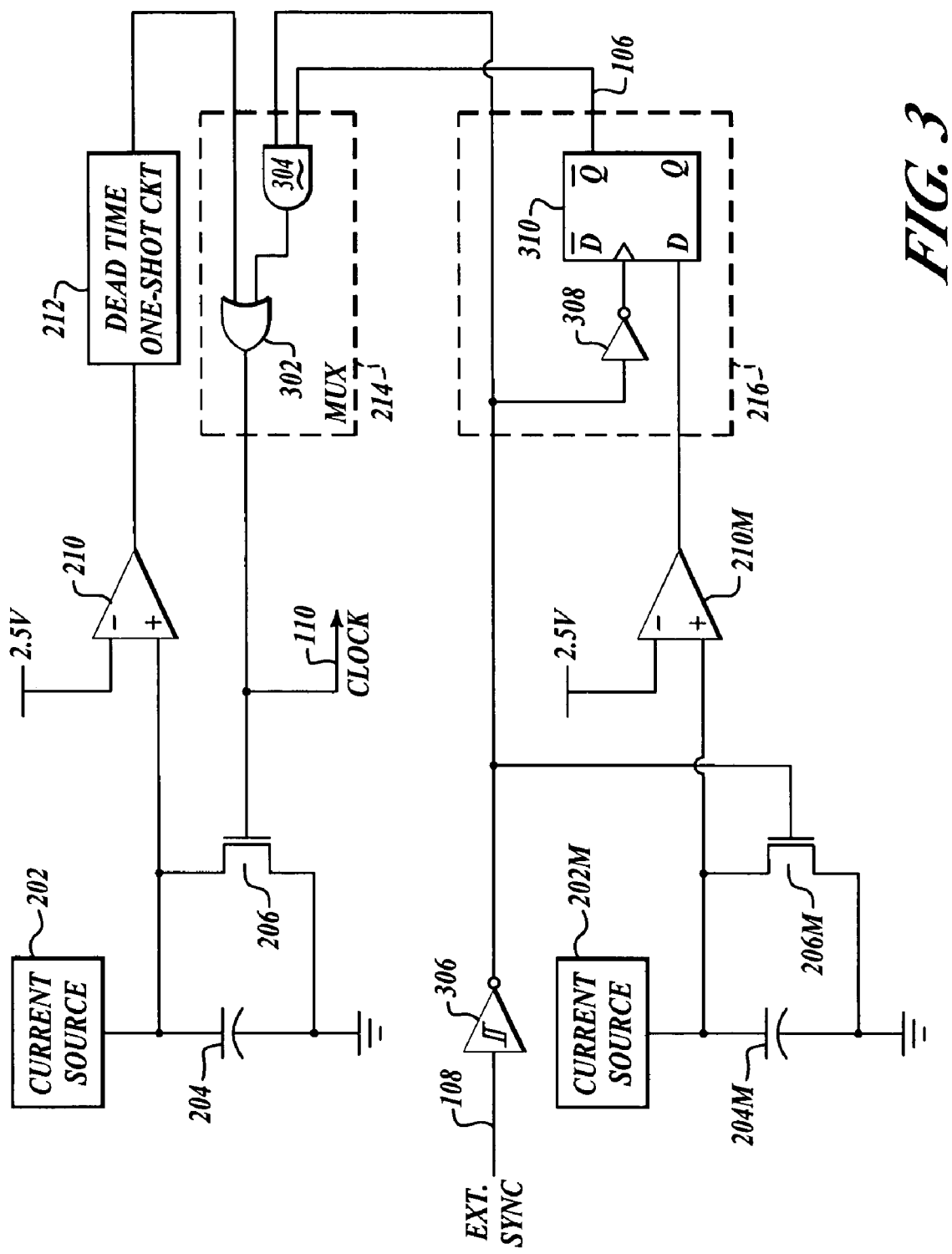
FIG. 3 is a diagram schematically representing an exemplary implementation of the minimum synchronization frequency discriminator, according to an embodiment.

FIG. 3 is a diagram schematically representing an exemplary implementation of minimum synchronization frequency discriminator 104, according to an embodiment. This embodiment is substantially similar to the embodiment of FIG. 2, but showing implementations of switches 206 and 206M, multiplexer 214, and sampling circuit 216. In addition, this embodiment includes a Schmitt trigger 306 to receive the external sync signal. Voltage regulator 208 outputs a 2.5 volt reference voltage in this example embodiment, and is omitted from FIG. 3 to avoid cluttering the illustration.

In this embodiment, switches 206 and 206M are implemented using N-channel transistors. In addition, multiplexer 214 is implemented using an OR-gate 302 and an AND-gate 304. AND-gate 304 is a two-input gate with one input terminal connected to sampling circuit 216 via line 106, and the other input terminal connected to the output terminal of Schmitt trigger 306 (which is connected to receive a large duty cycle external sync signal in this embodiment). The output terminal of AND-gate 304 is connected to one of the input terminals of two-input OR-gate 302. The other input terminal of OR-gate 302 is connected to the output terminal of dead-time one-shot circuit 212. The output terminal of the OR-gate is connected to the control terminal of switch 206 (i.e., the gate of an N-channel transistor in this embodiment).

In this embodiment, sampling circuit 216 is implemented using an inverter 308 and a D flip-flop 310. Inverter 308 is connected to receive the output signal from Schmitt trigger 306 and provide its output signal to the clock node of D flip-flop 310. In this embodiment, the non-inverting input node of D flip-flop 310 is connected to receive the output signal of comparator 210M. The inverted output node of D flip-flop 310 is connected to line 106 (and multiplexer 214).

Reference has been made throughout this specification to "one embodiment," "an embodiment," or "an example embodiment" meaning that a particular described feature, structure, or characteristic is included in at least one embodiment of the present invention. Thus, usage of such phrases may refer to more than just one embodiment. Furthermore, the described features, structures, or characteristics may be combined in any suitable manner in one or more embodiments.

In addition, embodiments of the present invention may be implemented not only with physical components (e.g., within a semiconductor chip), but also within machine-readable media. For example, the designs described above may be stored upon and/or embedded with machine readable media associated with a design tool used for designing semiconductor devices. Examples include designs defined/formatted in VHSIC Hardware Description Language (VHDL), Verilog language and SPICE language. Some netlist examples include: a behavior level netlist, a register transfer level (RTL) netlist, a gate level netlist, and a transistor level netlist. Machine readable media also include media having layout information such as a GDS-II file. Further, netlist files or other machine-readable media for semiconductor chip design may be used in a simulation to perform the methods of the embodiments disclosed herein.

Thus, embodiments of the present invention may be used as or to support software program(s) executed upon some form of processing core (e.g., a CPU of a computer) or otherwise implemented or realized upon or within a machine-readable medium. A machine-readable medium includes any mechanism for storing or transmitting information in a form readable by a machine (e.g. a computer). For example, a machine-readable medium can include read only memory (ROM), random access memory (RAM), magnetic disk storage media, optical storage media, flash memory devices, etc. In addition, machine-readable media can include propagated signals such as electrical, optical, acoustical or other form of propagated signal (e.g., carrier wave signals, infrared signals, digital signals, etc.)

One skilled in the relevant art may recognize, however, that the invention may be practiced without one or more of the specific details, or with other methods, resources, materials, etc. In other instances, well known structures, resources, or operations have not been shown or described in detail merely to avoid obscuring aspects of the invention.

While example embodiments and applications have been illustrated and described, it is to be understood that the invention is not limited to the precise configuration and resources described above. Various modifications, changes, and variations apparent to those skilled in the art may be made in the arrangement, operation, and details of the methods and systems of the present invention disclosed herein without departing from the scope of the claimed invention.

What is claimed is:

1. A circuit for use with an oscillator of a switch mode power supply, the circuit comprising:
   a replica circuit with a component that is substantially identical in performance to a corresponding component of the oscillator, wherein the replica circuit is to generate an output signal that depends on a received sync signal;
   a sample circuit coupled to receive the output signal of the replica circuit; and
   a multiplexer having:
      a control terminal coupled to an output terminal of the sample circuit,
      an input terminal coupled to receive an output signal of the oscillator, another input terminal coupled to receive the sync signal, and an output terminal coupled to a switch of the oscillator and to a clock output terminal of the circuit.

2. The circuit of claim 1 wherein the multiplexer selects the output signal of the oscillator in response to the sync signal's frequency being less than that of the output signal of the oscillator.

3. The circuit of claim 1 wherein the multiplexer selects the sync signal in response to the sync signal's frequency being greater than that of the output signal of the oscillator.

4. The circuit of claim 1 wherein the replica circuit further comprises:

a capacitor that is substantially identical in performance to a capacitor of the oscillator;

a current source coupled to charge the capacitor, wherein the current source is substantially identical in performance to a current source of the oscillator; and a switch having a control node coupled to receive the sync signal, wherein the switch is substantially identical in performance to the switch of the oscillator, wherein the switch is to short circuit the capacitor when closed.

5. The circuit of claim 4 wherein the replica circuit further comprises a comparator having an output terminal coupled to the sample circuit, an input terminal coupled to the capacitor and another input terminal coupled to receive a reference voltage.

6. The circuit of claim 1 further comprising a Schmitt trigger coupled to receive the sync signal.

7. The circuit of claim 1 wherein the sampling circuit comprises a flip-flop.

8. The circuit of claim 1 wherein the switch comprises a field effect transistor.

9. A circuit for use with an oscillator of a switch mode power supply, the circuit comprising:

means for generating an oscillating signal in response to a received sync signal, wherein the oscillating signal has a frequency dependent on that of the sync signal and rising and falling edges with slopes substantially identical to that of an oscillating signal generated by the oscillator, wherein the means for generating the oscillating signal comprises a capacitor that is substantially identical in performance to a capacitor of the oscillator and a current source coupled to charge the capacitor, wherein the current source is substantially identical in performance to a current source of the oscillator; and means for selectively coupling the sync signal to an output terminal of the circuit in response to the sync signal having a frequency greater than that of an output signal of the oscillator.

10. The circuit of claim 9 wherein the means for selectively coupling is further for selectively coupling the output signal of the oscillator to the output terminal of the circuit in response to the frequency of the sync signal being less than that of the output signal of the oscillator.

11. The circuit of claim 9 wherein the means for generating further comprises:

means for comparing a reference signal to the oscillating signal generated by the means for generating;

means for sampling an output signal of the means for comparing; and means for multiplexing having a control terminal coupled to receive an output signal from the means for sampling, a first input terminal coupled to receive the sync signal, and a second input terminal coupled to receive the output signal from the oscillator.

12. The circuit of claim 11 wherein the means for generating further comprises:

a switch having a control node coupled to receive the sync signal, wherein the switch is substantially identical in performance to the switch of the oscillator, wherein the switch is to short circuit the capacitor when closed.

13. The circuit of claim 9 further comprising a Schmitt trigger coupled to receive the sync signal.

14. The circuit of claim 11 wherein the means for sampling comprises a flip-flop.

15. The circuit of claim 12 wherein the switch comprises a field effect transistor.

16. A method to generate a clock signal for a circuit of a switch mode power supply having an oscillator, the method comprising:

generating an oscillating signal with a replica oscillator circuit in response to a received sync signal, wherein the oscillating signal has a frequency dependent on that of the sync signal and rising and falling edges with slopes substantially identical to that of an oscillating signal generated by the oscillator, wherein the replica oscillator circuit comprises a current source that is arranged to selectively charge a capacitor, wherein the capacitor and the current source are arranged for substantially identical performance to another capacitor and another current source in the oscillator of the switched mode power supply; and selectively coupling the sync signal to a clock output terminal of the circuit in response to the sync signal having a frequency greater than that of an output signal of the replica oscillator circuit.

17. The method of claim 16 wherein selectively coupling further comprises selectively coupling the output signal of the oscillator to the output terminal of the circuit in response to the frequency of the sync signal being less than that of the output signal of the oscillator.

18. A circuit for use with an oscillator of a switched mode power supply, wherein the oscillator of the switched mode power supply generates an oscillation signal with a ramp generator circuit, the circuit comprising:

a replica oscillator circuit that arranged to generate an output signal that depends on a received sync signal, wherein the replica oscillator circuit comprises a replica ramp generator circuit that is identically arranged with respect to the ramp generator such that the output signal has substantially identical rising and falling edges with respect to that of the oscillation signal generated by the oscillator of the switched mode power supply; and a means for selectively coupling one of the sync signal and the oscillation signal to an output terminal of the circuit in response to the sync signal, wherein the means for selectively coupling is arranged to couple the sync signal to the output terminal of the circuit when the a frequency of the sync signal is greater than that of the output signal of the oscillator.

* * * * *